United States Patent
Kim et al.

(10) Patent No.: US 12,243,941 B2
(45) Date of Patent: Mar. 4, 2025

(54) CONFORMAL OXIDATION FOR GATE ALL AROUND NANOSHEET I/O DEVICE

(71) Applicant: Applied Materials, Inc., Santa Clara, CA (US)

(72) Inventors: Myungsun Kim, Pleasanton, CA (US); Michael Stolfi, Clifton Park, NY (US); Benjamin Colombeau, San Jose, CA (US); Andy Lo, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 27 days.

(21) Appl. No.: 17/386,711

(22) Filed: Jul. 28, 2021

(65) Prior Publication Data
US 2022/0037529 A1 Feb. 3, 2022

Related U.S. Application Data

(60) Provisional application No. 63/060,087, filed on Aug. 2, 2020.

(51) Int. Cl.
*H01L 29/78* (2006.01)
*H01L 21/02* (2006.01)
(Continued)

(52) U.S. Cl.
CPC .... *H01L 29/7851* (2013.01); *H01L 21/02164* (2013.01); *H01L 21/02236* (2013.01);
(Continued)

(58) Field of Classification Search
CPC ......... H01L 29/66545; H01L 29/66795; H01L 29/785–7851; H01L 29/42392; H01L 29/0673; H01L 29/78696; H01L 29/66439; H01L 29/775; H01L 21/823431; H01L 21/823821; H01L 21/02301; H01L 21/02307; H01L 21/02312; H01L 21/02315; H01L 21/02236–02238;
(Continued)

(56) References Cited

U.S. PATENT DOCUMENTS 6,914,299 B2   7/2005   Wu
8,207,044 B2   6/2012   Mani et al.
(Continued)

FOREIGN PATENT DOCUMENTS

JP   2006310736 A   11/2006
KR   100630764 B1   10/2006
(Continued)

OTHER PUBLICATIONS

PCT International Search Report and Written Opinion in PCT/US2021/043820 dated Nov. 19, 2021, 11 pages.
(Continued)

*Primary Examiner* — Peniel M Gumedzoe
(74) *Attorney, Agent, or Firm* — Servilla Whitney LLC

(57) ABSTRACT

Horizontal gate-all-around devices and methods of manufacturing the same are described. The hGAA devices comprise an oxidize layer on a semiconductor material between source regions and drain regions of the device. The method includes radical plasma oxidation (RPO) of semiconductor material layers between source regions and drain regions of an electronic device.

13 Claims, 10 Drawing Sheets

(51) Int. Cl.
*H01L 21/8234* (2006.01)
*H01L 29/06* (2006.01)
*H01L 29/15* (2006.01)
*H01L 29/16* (2006.01)
*H01L 29/423* (2006.01)
*H01L 29/786* (2006.01)
*H01L 29/66* (2006.01)

(52) U.S. Cl.
CPC .. *H01L 21/02252* (2013.01); *H01L 21/02301* (2013.01); *H01L 21/823431* (2013.01); *H01L 29/0673* (2013.01); *H01L 29/157* (2013.01); *H01L 29/1604* (2013.01); *H01L 29/42392* (2013.01); *H01L 29/78696* (2013.01); *H01L 29/66545* (2013.01); *H01L 2029/7858* (2013.01)

(58) Field of Classification Search
CPC ......... H01L 21/02252; H01L 21/02164; H01L 27/0886; H01L 27/1211; H01L 27/0924
See application file for complete search history.

(56) References Cited

U.S. PATENT DOCUMENTS

| | | | |
|---|---|---|---|
| 10,332,881 B1 | 6/2019 | Badaroglu et al. | |
| 2005/0250338 A1 | 11/2005 | Ohmi et al. | |
| 2009/0029564 A1 | 1/2009 | Yamashita et al. | |
| 2009/0239364 A1 | 9/2009 | Nishita et al. | |
| 2014/0183633 A1* | 7/2014 | Chen | H01L 29/42356 438/157 |
| 2016/0111495 A1* | 4/2016 | Brand | H01L 21/30612 438/283 |
| 2017/0018462 A1 | 1/2017 | Suk et al. | |
| 2017/0229553 A1 | 8/2017 | Basker et al. | |
| 2017/0278865 A1 | 9/2017 | Ching et al. | |
| 2018/0156749 A1 | 6/2018 | Rozeau et al. | |
| 2018/0240871 A1 | 8/2018 | Cheng et al. | |
| 2019/0115438 A1 | 4/2019 | Ching et al. | |
| 2019/0371650 A1* | 12/2019 | Sun | H01L 29/78654 |
| 2019/0378906 A1* | 12/2019 | Loubet | H01L 21/823857 |
| 2019/0393097 A1* | 12/2019 | Tapily | H01L 29/775 |
| 2020/0035818 A1 | 1/2020 | Cea et al. | |
| 2020/0091149 A1* | 3/2020 | Lee | B82Y 10/00 |
| 2020/0135587 A1 | 4/2020 | Cheng et al. | |
| 2020/0152493 A1 | 5/2020 | Colombeau et al. | |
| 2020/0168715 A1 | 5/2020 | Wu et al. | |
| 2020/0335346 A1* | 10/2020 | Ouyang | H01L 29/6681 |

FOREIGN PATENT DOCUMENTS

| | | |
|---|---|---|
| KR | 20190111964 A | 10/2019 |
| WO | 9833362 A1 | 7/1998 |
| WO | 2006129643 A1 | 12/2006 |
| WO | 2013112702 A1 | 8/2013 |

OTHER PUBLICATIONS

Hellings, G., et al., "Si/SiGe superlattice I/O finFETs in a vertically-stacked Gate-All-Around horizontal Nanowire Technology", 2018 Symposium on VLSI Technology Digest of Technical Papers, downloaded May 27, 2021 from IEEE Xplore, two pages.

Joo, Sangrae, et al., "Study of Silicon Oxidation in a Remote Plasma-Enhanced Rapid Thermal Processor", Journal of the Korean Physical Society, vol. 51, No. 4, Oct. 2007, pp. 1337-1343.

\* cited by examiner derlyers formed on the substrate as disclosed in more

CONFORMAL OXIDATION FOR GATE ALL AROUND NANOSHEET I/O DEVICE

CROSS-REFERENCE TO RELATED APPLICATIONS

This application claims priority to U.S. Provisional Application No. 63/060,087, filed Aug. 2, 2020, the entire disclosure of which is hereby incorporated by reference herein.

TECHNICAL FIELD

Embodiments of the disclosure generally relate to methods for filling substrate features. More particularly, embodiments of the disclosure are directed to methods for forming high quality I/O oxides.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

Conventional I/O oxide processes result in ex situ pre-clean immediately re-growing poor quality native oxide, ALD type oxide deposition with low density, deposition that linearly decreases the space between nanosheet-nanosheet, limiting down-stream integration (i.e. multi-Vt), and the need for additional post treatment to densify the ALD film, which adds cost and complexity.

SUMMARY

One or more embodiments of the disclosure are directed to a method of forming a semiconductor device. The method comprises pre-cleaning a plurality of first layers to remove native oxide and/or residues; and forming an oxide layer on the plurality of first layers.

Another embodiment of the disclosure is directed to a horizontal gate-all-around device. The processing device comprises: an oxide layer surrounding a plurality of horizontal first layers between a source region and a drain region.

Other embodiments of the disclosure are directed to a non-transitory computer readable medium including instructions, that, when executed by a controller of a processing chamber, causes the processing chamber to perform operations of: pre-clean a plurality of first layers to remove native oxide and/or residues; and form an oxide layer on the plurality of first layers using radical plasma oxidation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
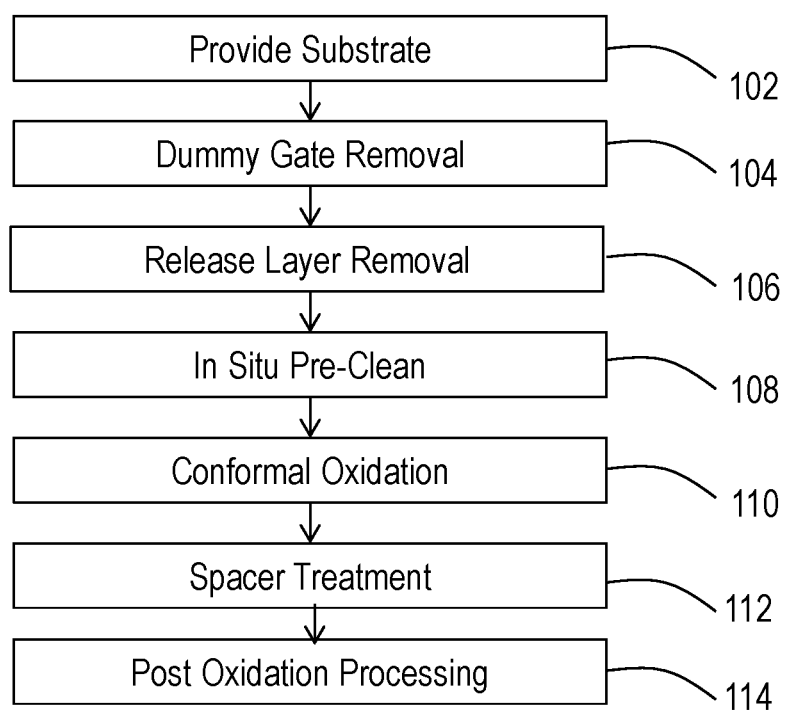
FIG. 1 is a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated ID. Drain-to-source voltage is designated VDs. By applying voltage to gate (G), the current entering the channel at the drain (i.e. ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (Fin-FET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g. a transistor, in which the gate material surrounds the channel region on all sides. The channel region of a GAA transistor may include nano-wires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g. DRAM) and non-volatile (e.g. NAND) devices.

Conventional I/O oxide processes result in ex situ pre-clean immediately re-growing poor quality native oxide, ALD type oxide deposition with low density, deposition that linearly decreases the space between nanosheet-nanosheet, limiting down-stream integration (i.e. multi-Vt), and the need for additional post treatment to densify the ALD film which adds cost and complexity. Accordingly, one or more embodiments advantageously provide an integrated and selective pre-clean process which removes poor quality native oxide and suppress re-growth, eliminating q-time between the pre-clean and I/O oxide formation. In one or more embodiments, the oxidation is advantageously dense, so no post-treatment densification step is required. In one or more embodiments, the silicon nanosheet (NS) is advantageously consumed while it grows, creating more NS-NS space and facilitating down-stream integration window (i.e. multi-Vt). Some embodiments advantageously drive down the dielectric constant, k-value, of the gate and inner spacer by partially oxidizing the surface.

One or more embodiments of the disclosure are described with reference to the Figures. In the method of one or more embodiments, gate all-around transistors are fabricated using a standard process flow. In one or more embodiments, after dummy gate removal, an integrated (in situ) pre-clean is performed to remove the dummy gate oxide. Without breaking the vacuum, conformal oxidation and spacer treatment follows.

FIG. 1 illustrates a process flow diagram for a method 100 for forming a semiconductor device in accordance with some embodiments of the present disclosure. The method 100 is described below with respect to FIGS. 2A-2F, which depict the stages of fabrication of semiconductor structures in accordance with some embodiments of the present disclosure. FIGS. 2A-2F are cross-sectional views of an electronic device (e.g. a hGAA) according to one or more embodiments. The method 100 may be part of a multi-step fabrication process of, a semiconductor device. Accordingly, the method 100 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figure 2A:
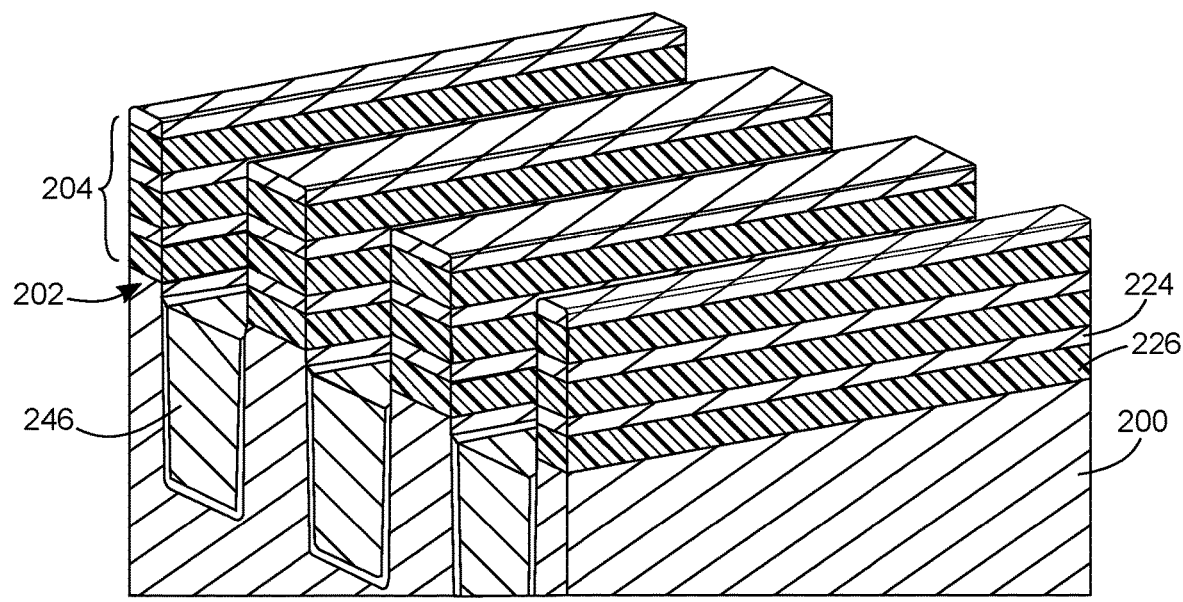
FIGS. 2A-2F illustrate cross-sectional views of an electronic device according to one or more embodiments.

The method 100 begins at operation 102, by providing a substrate 200 having a top surface 202 (as illustrated in FIG. 2A). In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate may be doped to provide a high dose of dopant at a first location of the surface of the substrate 200 in order to prevent parasitic bottom device turn on. For example, in some embodiments, the surface of the substrate may have a dopant density about $10^{18}$ atoms/cm$^3$ to about 1019 atoms/cm$^3$.

At least one superlattice structure 204 is formed atop the top surface 202 of the substrate 200 (as depicted in FIG. 2A). The superlattice structure 204 comprises a plurality of first layers 224 and a corresponding plurality of second layers 226 alternatingly arranged in a plurality of stacked pairs. In some embodiments the plurality of stacked groups of layers comprises a silicon (Si) and silicon germanium (SiGe) group. In some embodiments, the plurality of first layers 224 and corresponding plurality of second layers 226 can comprise any number of lattice matched material pairs suitable for forming a superlattice structure 204. In some embodiments, the plurality of first layers 224 and corresponding plurality of second layers 226 comprise from about 2 to about 50 pairs of lattice matched materials.

Typically, a parasitic device will exist at the bottom of the superlattice structure 204. In some embodiments, implantation of a dopant in the substrate, as discussed above, is used to suppress the turn on of the parasitic device. In some embodiments, the substrate 200 is etched so that the bottom portion of the superlattice structure 204 includes a substrate portion which is not removed, allowing the substrate portion to act as the bottom release layer of the superlattice structure 204.

In one or more embodiments, the thicknesses of the first layers 224 and second layers 226 in some embodiments are in the range of from about 2 nm to about 50 nm, in the range of from about 3 nm to about 20 nm, or in a range of from about 2 nm to about 15 nm. In some embodiments, the average thickness of the first layers 224 is within 0.5 to 2 times the average thickness of the second layers 226.

In some embodiments, a dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

Figure 2B:
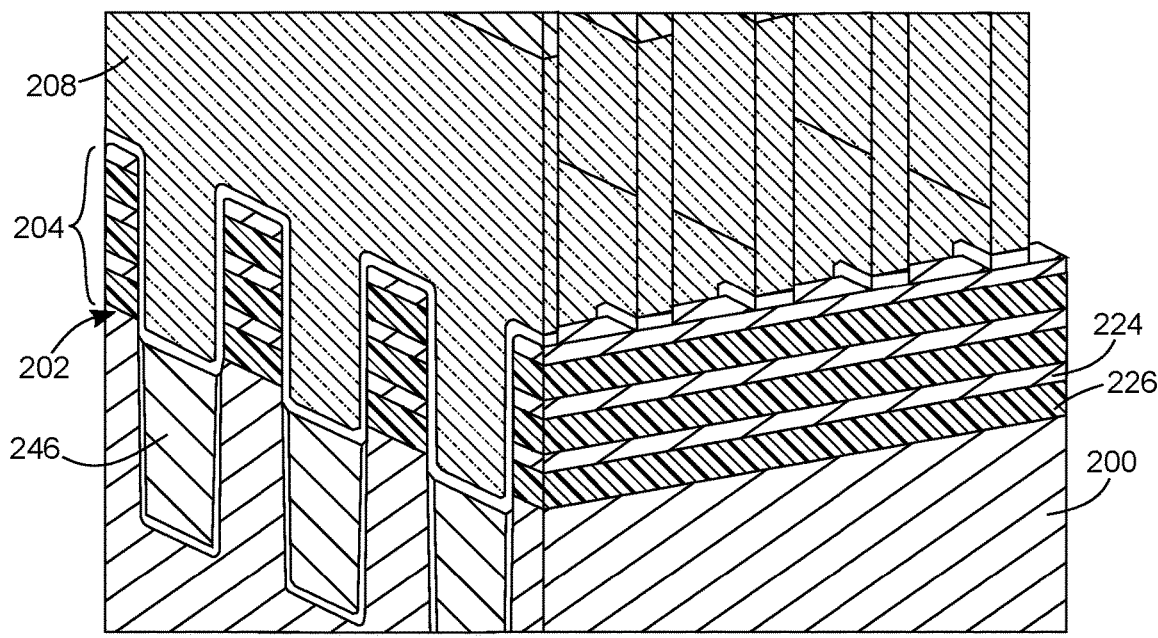
Figure 2C:
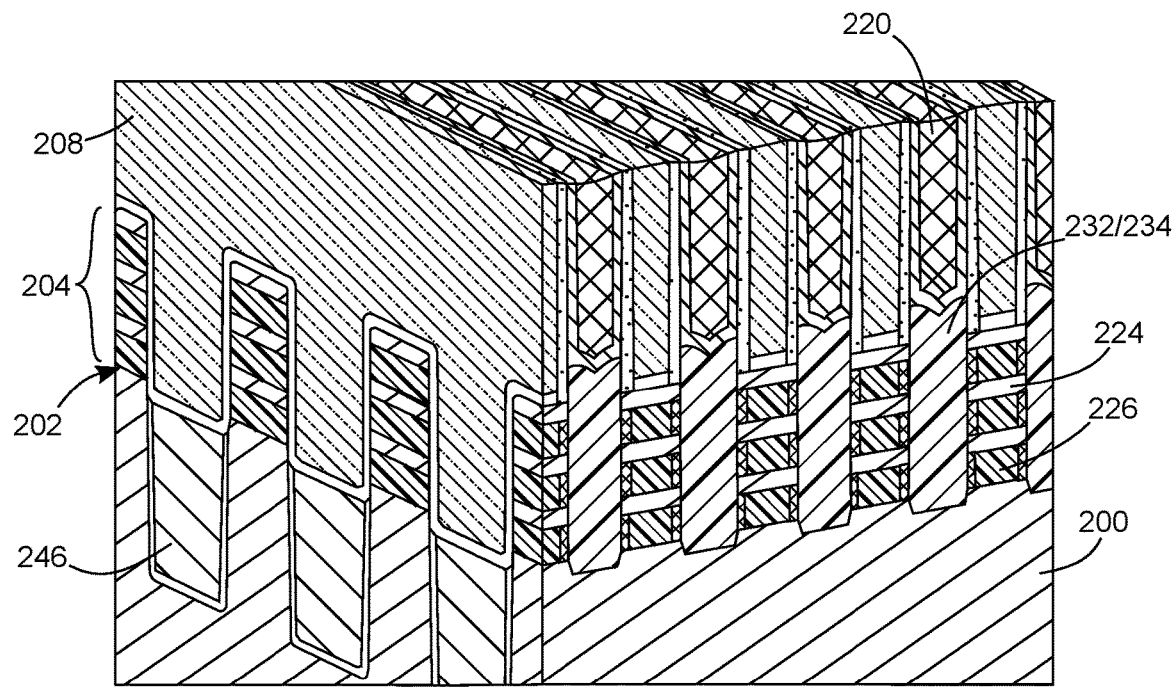

Referring to FIG. 2B, in some embodiments, a replacement gate structure (e.g., a dummy gate structure 208) is formed over and adjacent to the superlattice structure 204. The dummy gate structure 208 defines the channel region of the transistor device. The dummy gate structure 208 may be formed using any suitable conventional deposition and patterning process known in the art.

In some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low pressure chemical vapor deposition.

In some embodiments, the embedded source region 232 and drain region 234 form in a source trench and a drain trench, respectively. In some embodiments, the source region 232 is formed adjacent a first end of the superlattice structure 204 and the drain region 234 is formed adjacent a second, opposing end of the superlattice structure. In the embodiment illustrated in FIG. 2C, one of the source region 232 or drain region 234 is shown at the front face of the superlattice structure 204. The other end of the superlattice structure 204 has the other of the source region 232 or drain region 234. In some embodiments, the source region 232 and/or drain region 234 are formed from any suitable semiconductor material, such as but not limited to silicon, germanium, silicon germanium, or the like. In some embodiments, the source region 232 and drain region 234 may be formed using any suitable deposition process, such as an epitaxial deposition process.

In some embodiments, an inter-layer dielectric (ILD) layer 220 is blanket deposited over the substrate 200, including the source/drain regions 232, 234, the dummy gate structure 208, and the sidewall spacers 210. The ILD layer 220 may be deposited using a conventional chemical vapor deposition method (e.g., plasma enhance chemical vapor deposition and low pressure chemical vapor deposition). In one or more embodiments, ILD layer 220 is formed from any suitable dielectric material such as, but not limited to, undoped silicon oxide, doped silicon oxide (e.g., BPSG, PSG), silicon nitride, and silicon oxynitride. In one or more embodiments, ILD layer 220 is then polished back using a conventional chemical mechanical planarization method to expose the top of the dummy gate structure 208. In some embodiments, the ILD layer 220 is polished to expose the top of the dummy gate structure 208 and the top of the sidewall spacers 210.

Figure 2D:
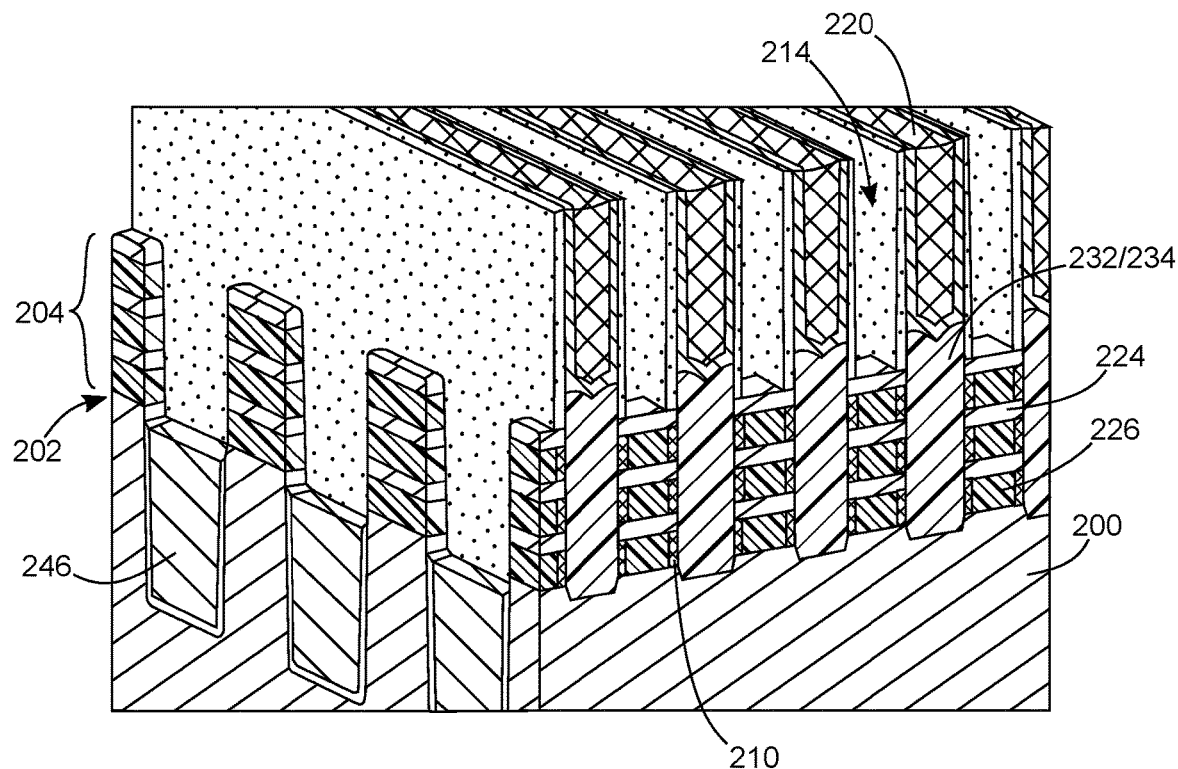

In operation 104, as shown in FIG. 2D, the dummy gate structure 208 is removed to expose the channel region 214 of the superlattice structure 204. The ILD layer 220 protects the source/drain regions 232, 234 during the removal of the dummy gate structure 208. The dummy gate structure 208 may be removed using any conventional etching method such as a plasma dry etch or a wet etch. In some embodiments, the dummy gate structure 208 comprises poly-silicon and the dummy gate structure 208 is removed by a selective etch process. In some embodiments, the dummy gate structure 208 comprises poly-silicon and the superlattice structure 204 comprises alternating layers of silicon (Si) and silicon germanium (SiGe).

Figure 2E:
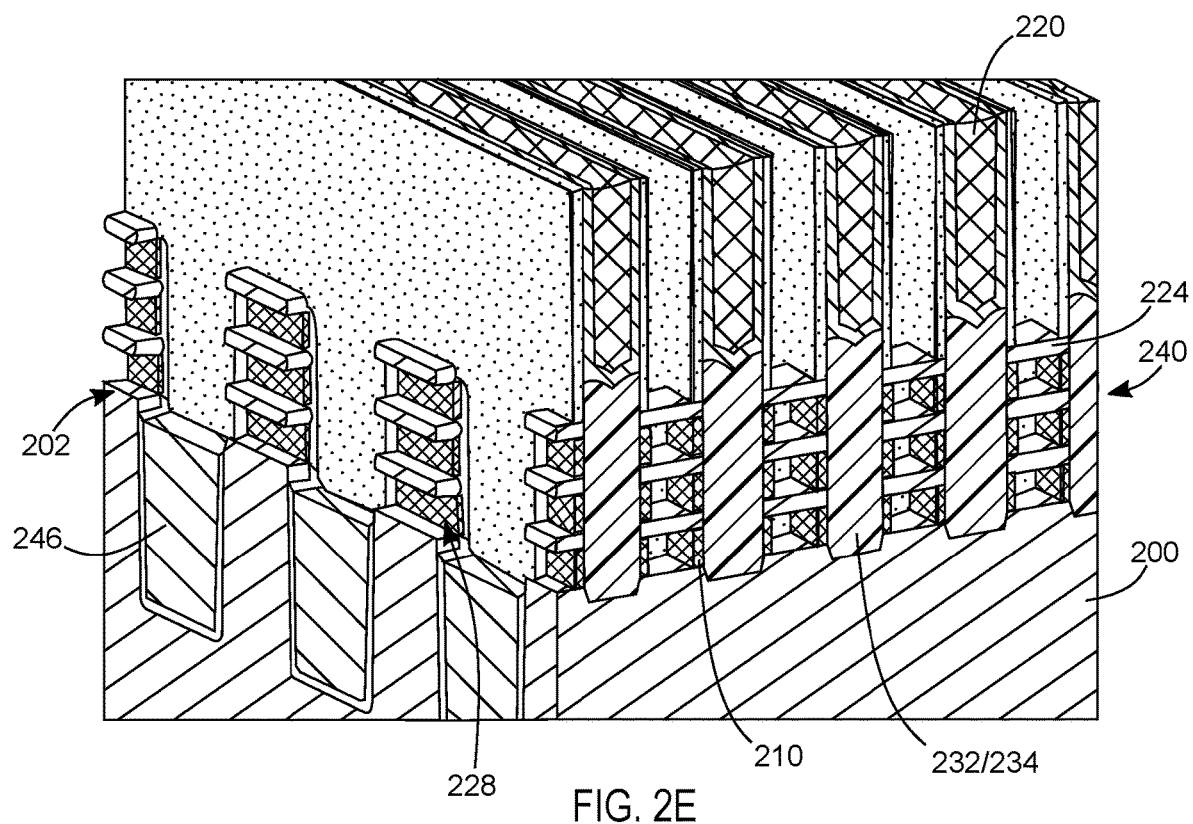

In operation 106, as shown in FIG. 2E, the second layers 226 are selectively etched between the first layers 224 in the superlattice structure 204. For example, where the superlattice structure 204 is composed of silicon (Si) layers and silicon germanium (SiGe) layers, the silicon germanium (SiGe) is selectively etched to form channel nanowires 240. The second layers 226, for example silicon germanium (SiGe), may be removed using any well-known etchant that is selective to the layers of the first layers 224 where the etchant etches the layers of second layers 226 at a significantly higher rate than the layers of first layers 224. In some embodiments, a selective dry etch or wet etch process may be used. In some embodiments, where the first layers 224 are silicon (Si) and the second layers 226 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the second layers 226 leaves voids 228 between the first layers 224. The voids 228 between the first layers 224 have a thickness of about 3 nm to about 20 nm. The remaining first layers 224 form a vertical array of channel nanowires 240 that are coupled to the source/drain regions 232, 234. The channel nanowires 240 run parallel to the top surface 202 of the substrate 200 and are aligned with each other to form a single column of channel nanowires 240. The formation of the source region 232 and drain region 234 and the formation of an optional lateral etch stop layer advantageously provide self-alignment and structural integrity in the formation of the channel structure.

Figure 2F:
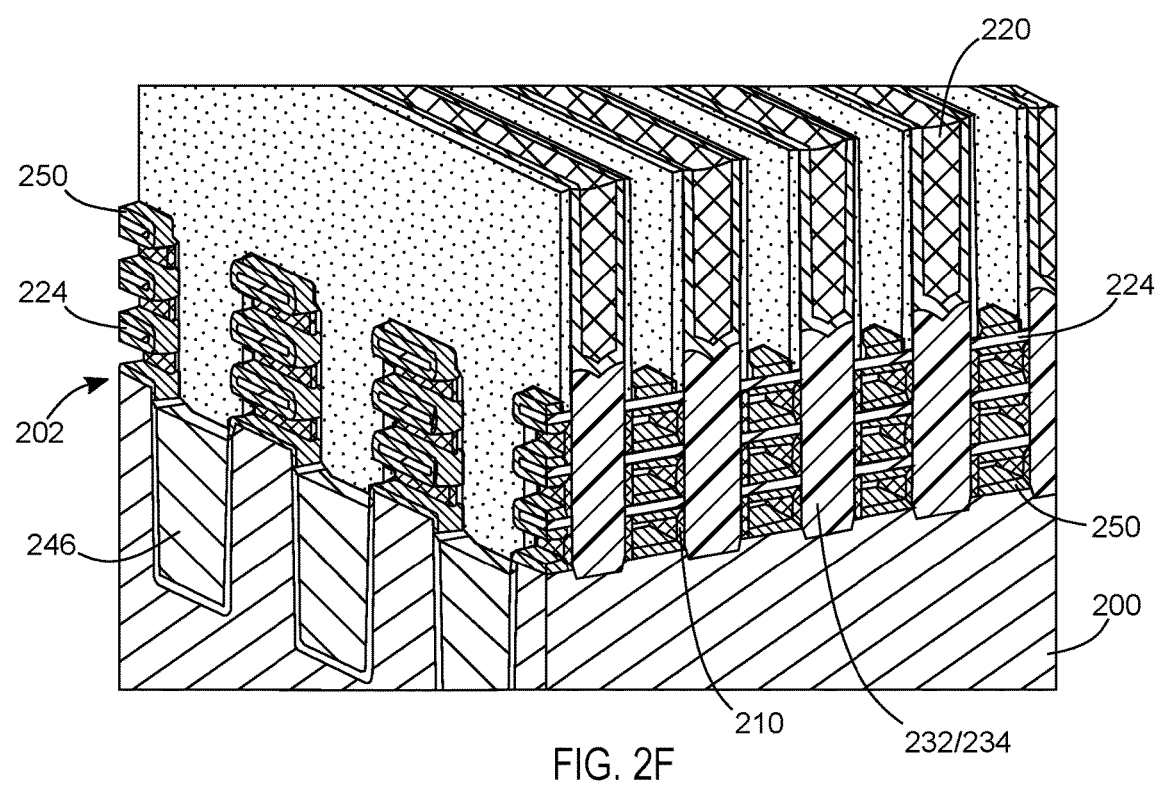
Figure 3A:
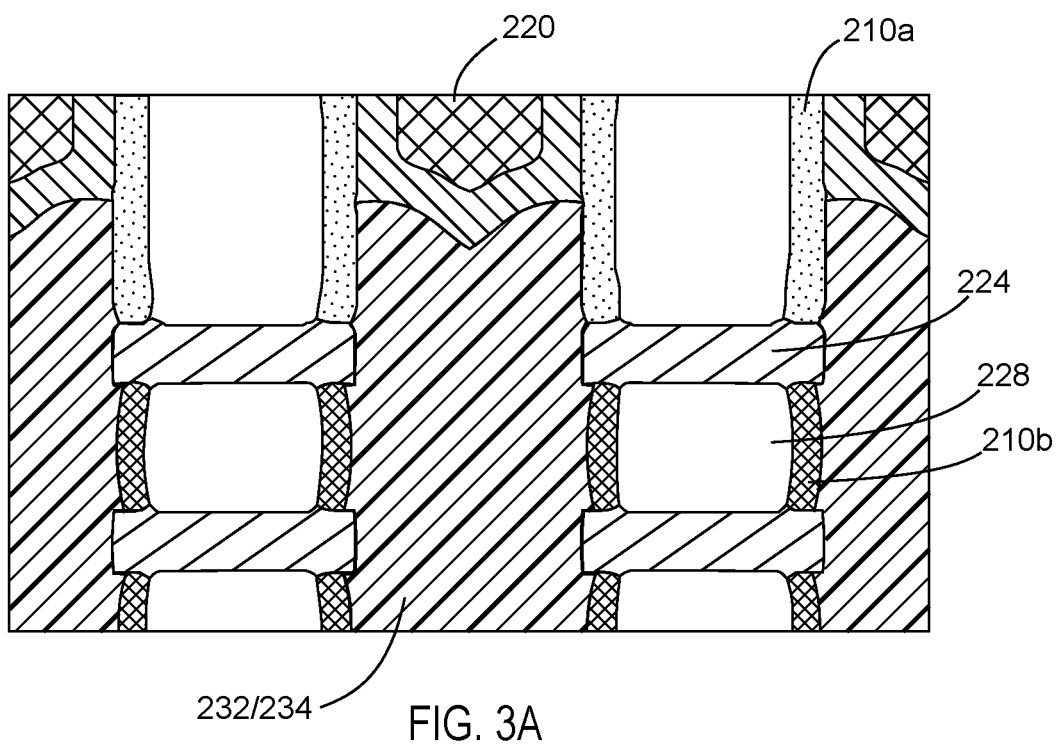
FIGS. 3A-3G illustrate cross-sectional views of an electronic device according to one or more embodiments.
Figure 3B:
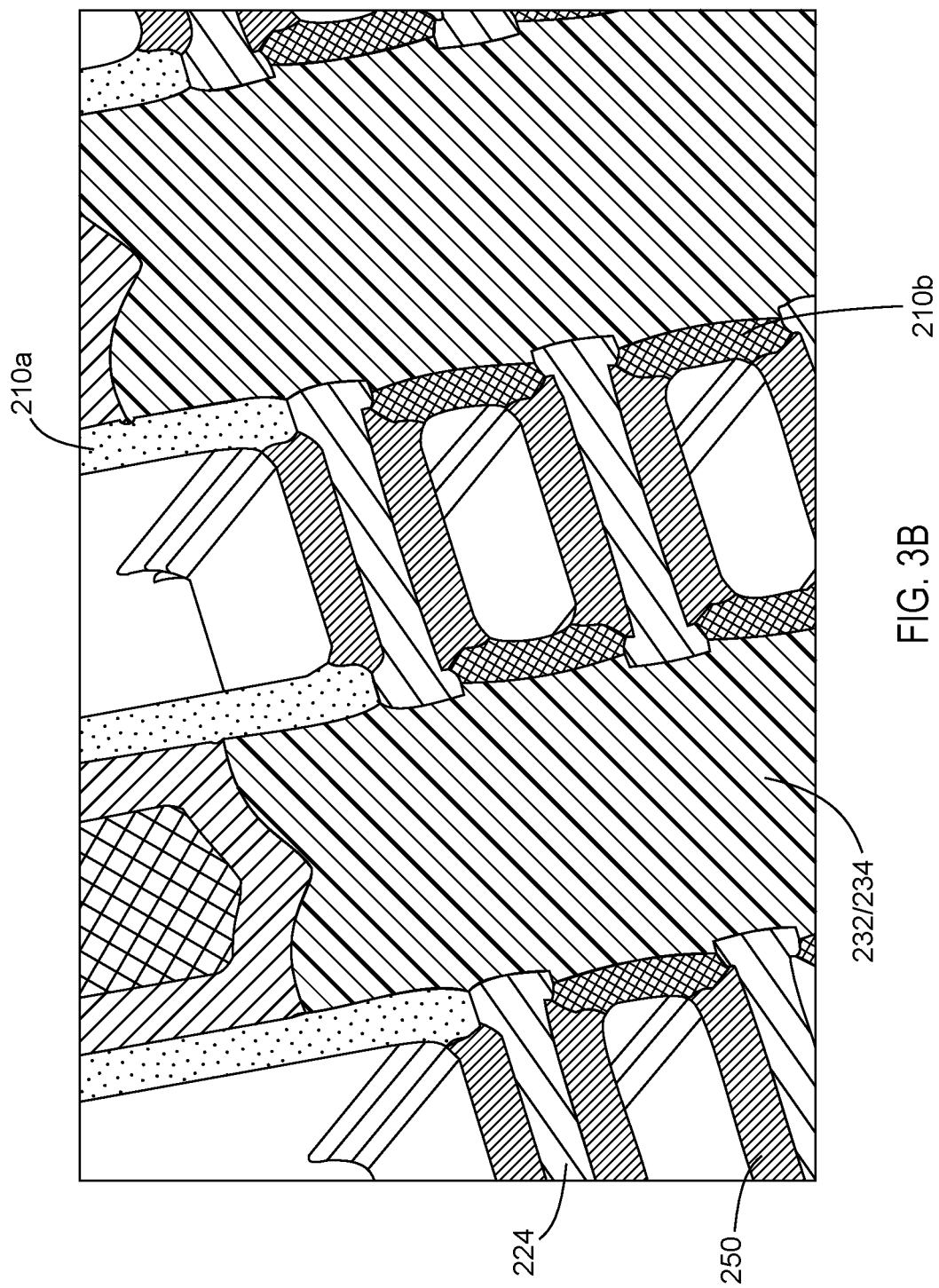

In operation 108, as illustrated in FIGS. 2F and 3A-3B, the device is in situ pre-cleaned to remove any oxide on the gate. The pre-clean can remove native oxide present on a surface of the gate. In pre-clean process may include a dry etch process, a wet etch process, or a combination of both.

In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Referring to FIGS. 3A and 3B, the inner spacer 210 may comprise different materials. In some embodiments, the inner spacer 210b located between two adjacent nanosheet first layers 224 may comprise silicon nitride (SiN). In other embodiments, the inner space 210a located on a top surface of the nanosheet semiconductor layer 224 may comprises a low-k material that is different from inner spacer 210b.

Figure 3C:
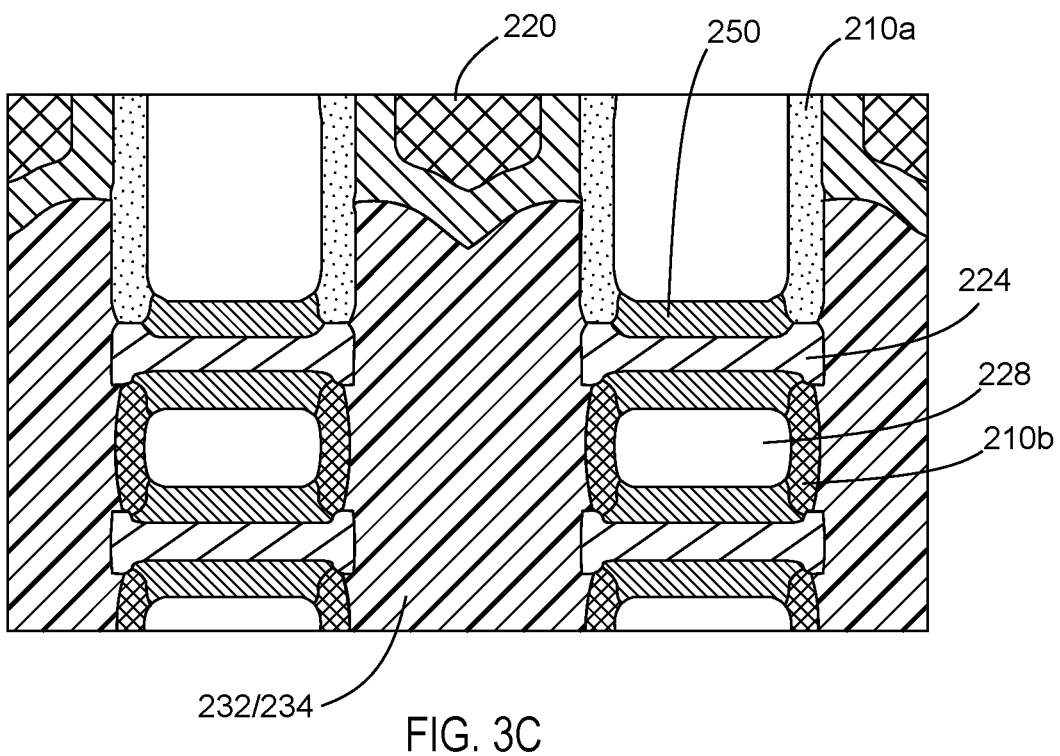
Figure 3D:
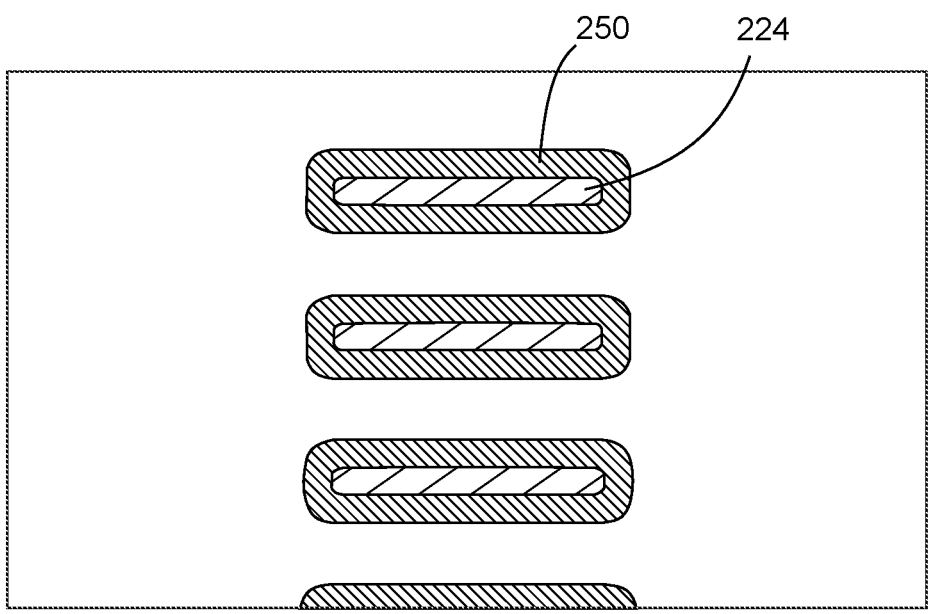

Referring to FIG. 2F and FIGS. 3C-3D, at operation 110, an oxide layer 250 is formed on the first layers 224. In one or more embodiments, the oxide layer 250 is formed by radical plasma oxidation (RPO) at a temperature in a range of from about 700° C. to about 900° C. in an atmosphere of hydrogen ($H_2$) gas and oxygen ($O_2$) gas at ambient pressure. The oxide layer 250 may comprise any suitable material known to the skilled artisan. In one or more embodiments, the oxide layer 250 comprises silicon oxide ($SiO_x$). FIG. 3D is a schematic of how the oxide layer 250 grows on the first layers 224. In one or more embodiments, the oxide layer 250 grows (or forms) conformally on the surface of the first layer 224. The oxide layer 250 is dense because the first layer 224 is directly oxidized. The oxidation consumes the first layer 224 (e.g. silicon (Si)) nanosheet, securing more space, e.g. distance, width, between each nanosheet first layer 224, thus facilitating the down-stream integration window (i.e. multi-Vt). In one or more embodiments, the first layer 224 comprises silicon (Si), and the oxide layer 250 comprises silicon oxide ($SiO_x$), and the ratio of the silicon oxide ($SiO_x$) to silicon (Si) is about 3:1. In some embodiments, the oxide layer 250 has an oxide layer thickness, $t_O$, and the first layer 224 has a first layer thickness, $t_S$, and the ratio of the oxide layer thickness to the first layer thickness is 3:1.

In addition to the oxidation consuming the first layer 224, at operation 112, the spacer 210 is partially oxidized, driving down the dielectric constant, k-value, of the spacer 210.

Figure 3E:
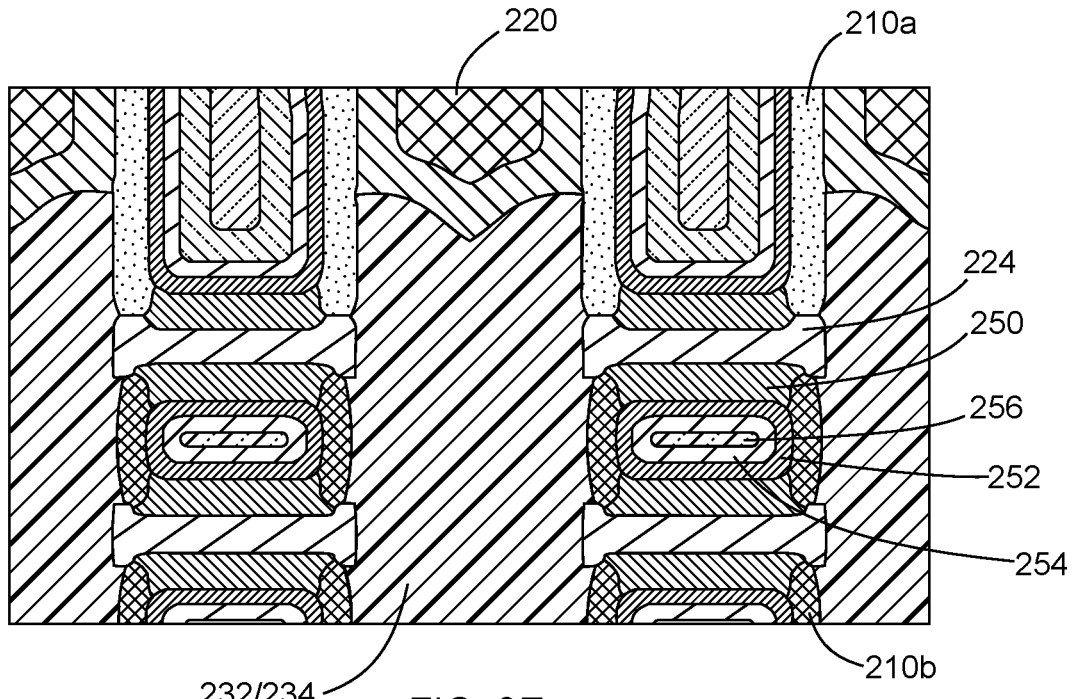
Figure 3F:
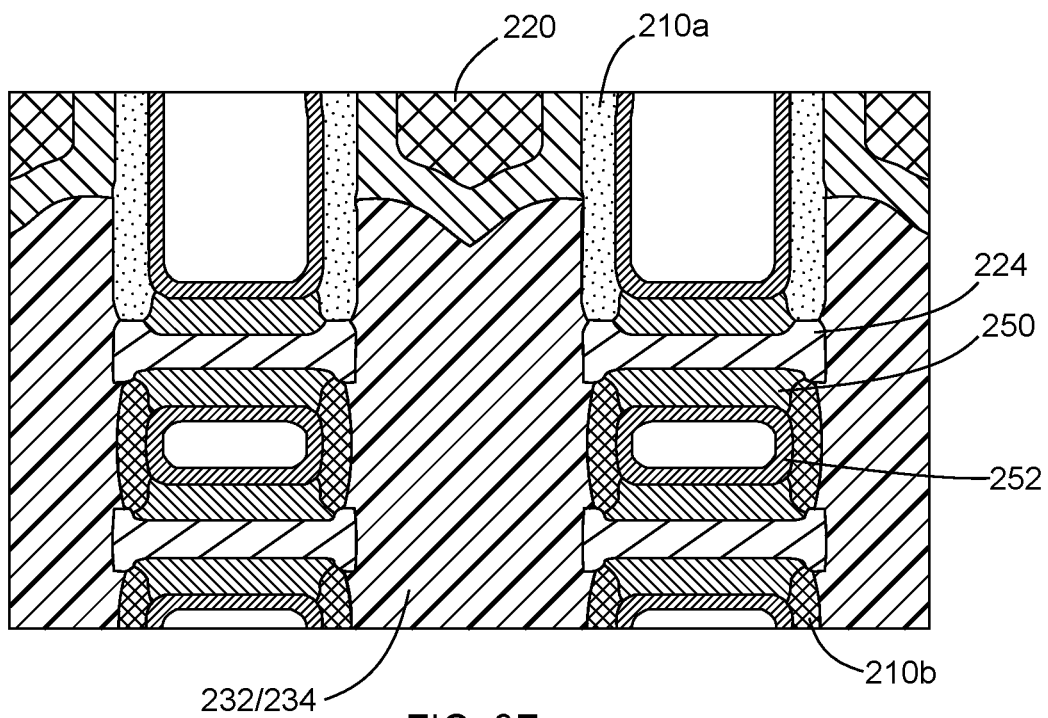
Figure 3G:
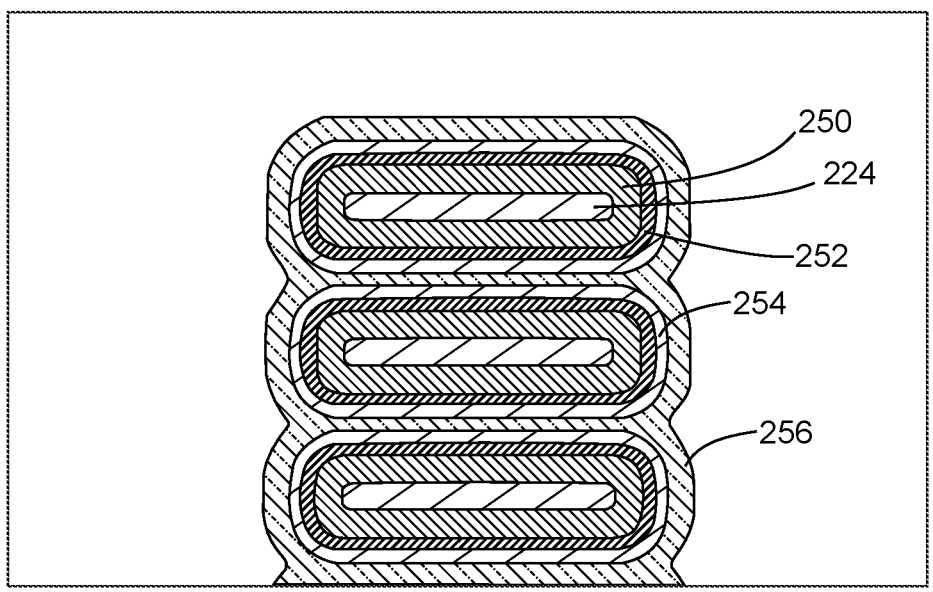

In one or more embodiments, operation 114 of method 100 represents one or more post-oxidation processing operations. The one or more post-oxidation processes can by any of the processes known to the skilled artisan for completion of the hGAA device. Referring to FIGS. 3E-3G, in some embodiments, a high-k dielectric 252 is formed on the oxide layer 250. The high-k dielectric 252 can be any suitable high-k dielectric material deposited by any suitable deposition technique known to the skilled artisan. The high-k dielectric 252 of some embodiments comprises hafnium oxide. In some embodiments, a conductive material 254 such as titanium nitride (TiN), tungsten (W), cobalt (Co), aluminum (Al), or the like is deposited on the high-k dielectric 252. The conductive material 254 may be formed using any suitable deposition process such as, but not limited to, atomic layer deposition (ALD) in order to ensure the formation of a layer having a uniform thickness around each of the first layer 224.

In some embodiments, a gate electrode 256 is formed on the substrate 200 and surrounds the conductive material 254. The gate electrode 256 may be formed from any suitable gate electrode material known in the art. The gate electrode material 256 is deposited using any suitable deposition process such as atomic layer deposition (ALD) to ensure that gate electrode 256 is formed around and between each of the first layers 224.

The resultant device formed using the method described herein is a horizontal gate all (hGAA) around device, in accordance with an embodiment of the present disclosure. Some embodiments of the disclosure are directed to horizontal gate-all-around devices comprising a RPO oxide layer 250 around a first layer 224 as a nano-wire or nano-slab in the channel between source and drain regions.

One or more embodiments of the disclosure are directed to methods of forming a semiconductor device. In one or more embodiments, a method of forming a semiconductor device, comprises: selectively etching a superlattice structure comprising a plurality of first layers and a corresponding plurality of second layers alternatingly arranged in a plurality of stacked pairs to remove each of the first layers or each of the second layers to form a plurality of voids in the superlattice structure and a plurality of first layers extending between a source region and a drain region; and oxidizing the plurality of first layers to form oxidized first layers.

Figure 4:
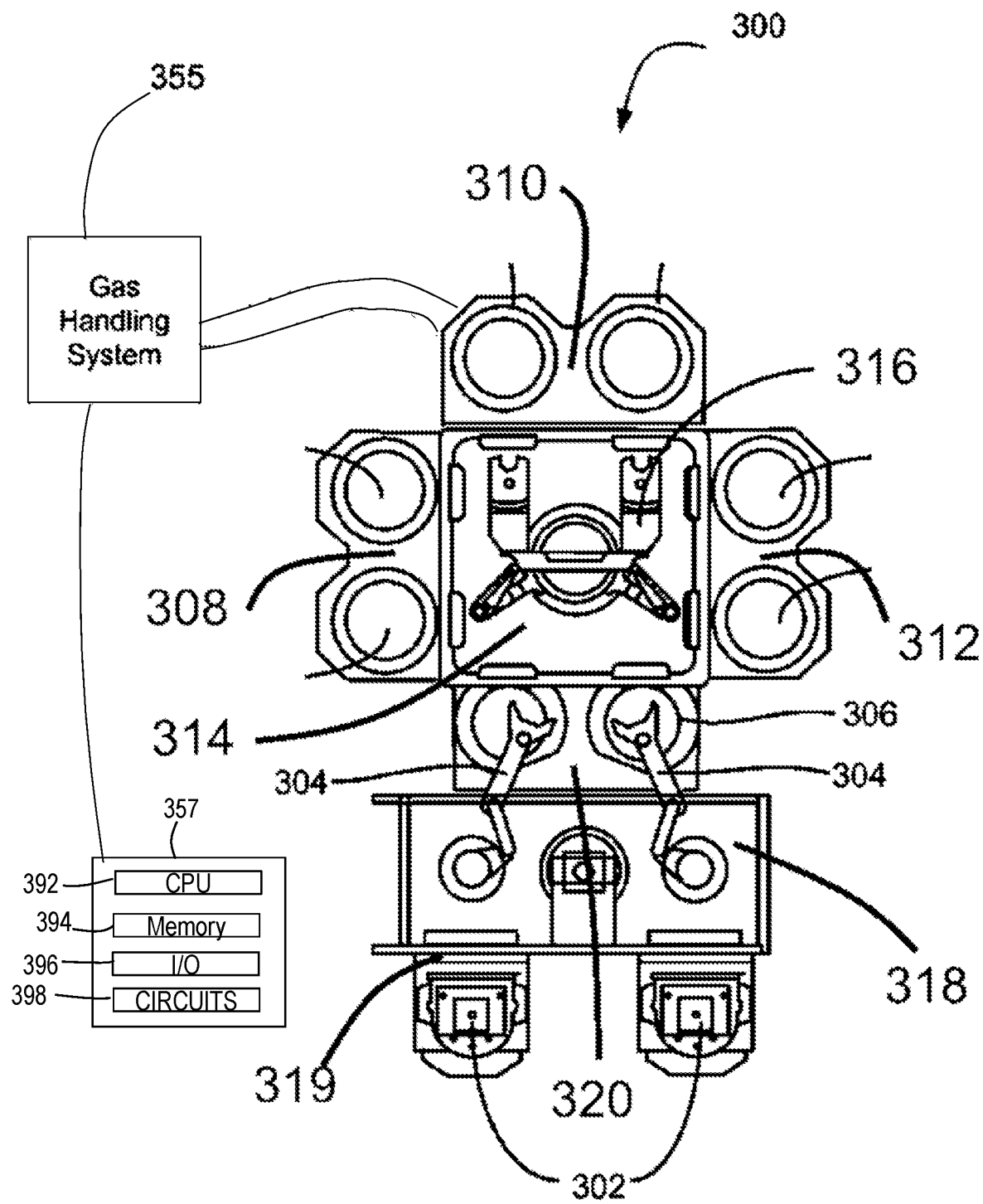
FIG. 4 illustrates a cluster tool according to one or more embodiments.

Additional embodiments of the disclosure are directed to processing tools 300 for the formation of the GAA devices and methods described, as shown in FIG. 4. A variety of multi-processing platforms, including the Centura®, Dual ACP, Producer® GT, and Endura® platform, available from Applied Materials® as well as other processing systems may be utilized. With reference to FIG. 4, a cluster tool 300 includes at least one central transfer station 314 with a plurality of sides. A robot 316 is positioned within the central transfer station 314 and is configured to move a robot blade and a wafer to each of the plurality of sides.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

Referring to FIG. 4, the cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a preclean chamber, a deposition chamber, an annealing chamber, an etching chamber, a selective etching chamber, and the like. The particular arrangement of process chambers and components can be varied depending on the cluster tool and should not be taken as limiting the scope of the disclosure.

In some embodiments, the cluster tool 300 includes an isotropic etching chamber for selectively etching/trimming the first layers 224. The isotropic etching chamber of some embodiments comprises one or more a fluorine-based dry etching chamber. In some embodiments, the cluster tool 300 includes a pre-cleaning chamber connected to the central transfer station.

In the embodiment shown in FIG. 4, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 357 has a configuration to control the deposition of oxide layer 250 on the first layers 224 and the spacers 210.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma chamber, a curing chamber, an etching chamber; and a controller connected to the central transfer station and the plurality of process stations, the controller configured to activate the robot to move the wafer between process stations, and to control a process occurring in each of the process stations.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, comprising:
   selectively etching a superlattice structure comprising a plurality of first layers and a corresponding plurality of second layers alternatingly arranged in a plurality of stacked pairs to remove each of the second layers to form a plurality of voids in the superlattice structure, the plurality of first layers extending between a source region and a drain region, and each of the plurality of first layers separated by a silicon oxide (SiOx) inner spacer;
   pre-cleaning the plurality of first layers and silicon oxide (SiOx) inner spacer to remove native oxide and/or residues; and
   conformally forming an oxide layer on the plurality of first layers and converting the silicon oxide (SiOx) inner spacer to a low-k dielectric inner spacer by radical plasma oxidation (RPO) of the plurality of first layers and the silicon oxide (SiOx) inner spacer, the radical plasma oxidation occurring at a temperature in a range of from about 700° C. to about 900° C. in an atmosphere of hydrogen ($H_2$) gas and oxygen ($O_2$) gas at ambient pressure,
   wherein the method is performed in a processing chamber without breaking vacuum.

2. The method of claim 1, further comprising forming the source region adjacent a first end of the superlattice structure and the drain region adjacent a second opposing end of the superlattice structure.

3. The method of claim 1, further comprising forming the superlattice structure on a top surface of a substrate.

4. The method of claim 1, wherein semiconductor device comprises a horizontal gate-all-around device.

5. The method of claim 1, wherein the first layers comprise silicon (Si) and the second layers comprise silicon germanium (SiGe).

6. The method of claim 5, wherein selectively etching the superlattice structure comprises etching the silicon germanium (SiGe) first layers and leaving the silicon (Si) second layers.

7. The method of claim 5, wherein the oxide layer comprises silicon oxide ($SiO_x$).

8. The method of claim 1, wherein a thickness of the first layers and the second layers are each about 3 nm to about 20 nm.

9. The method of claim 1, further comprising:
   forming a high-k dielectric layer on the oxide layer; and
   forming a conductive layer on the high k dielectric layer.

10. The method of claim 9, wherein the high-k dielectric comprises hafnium oxide and the conductive layer comprises one or more of titanium nitride (TiN), tungsten (W), cobalt (Co), and aluminum (Al).

11. A non-transitory computer readable medium, having instructions stored thereon which, when executed, cause a method of forming a semiconductor device, the method comprising:
   selectively etch a superlattice structure comprising a plurality of first layers and a corresponding plurality of second layers alternatingly arranged in a plurality of stacked pairs to remove each of the second layers to form a plurality of voids in the superlattice structure, and the plurality of first layers extending between a source region and a drain region, and each of the plurality of first layers separated by a silicon oxide (SiOx) inner spacer;
   pre-clean the plurality of first layers and the silicon oxide (SiOx) inner spacer to remove native oxide and/or residues; and
   conformally form an oxide layer on the plurality of first layers and convert the silicon oxide (SiOx) inner spacer to a low-k dielectric inner spacer using radical plasma oxidation of the plurality of first layers and the silicon oxide (SiOx) inner spacer, the radical plasma oxidation occurring at a temperature in a range of from about 700° C. to about 900° C. in an atmosphere of hydrogen ($H_2$) gas and oxygen ($O_2$) gas at ambient pressure,
   wherein the oxide layer has an oxide layer thickness and the first layer has a first layer thickness and the ratio of the oxide layer thickness to the first layer thickness is about 3:1, and
   wherein the method is performed in a processing chamber without breaking vacuum.

12. The method of claim 1, wherein the oxide layer has an oxide layer thickness and the first layer has a first layer thickness and the ratio of the oxide layer thickness to the first layer thickness is 3:1.

13. The non-transitory computer readable medium of claim 11, wherein the oxide layer has an oxide layer thickness and the first layer has a first layer thickness and the ratio of the oxide layer thickness to the first layer thickness is 3:1.

* * * * *

UNITED STATES PATENT AND TRADEMARK OFFICE
CERTIFICATE OF CORRECTION

Page 1 of 1

PATENT NO. : 12,243,941 B2
APPLICATION NO. : 17/386711
DATED : March 4, 2025
INVENTOR(S) : Myungsun Kim et al.

It is certified that error appears in the above-identified patent and that said Letters Patent is hereby corrected as shown below:

In the Claims

•Column 12, Claim 6, Line 17, after "(SiGe)", replace "first layers" with "second layers".

•Column 12, Claim 6, Line 17, after "silicon (Si)", replace "second layers" with "first layers".

Signed and Sealed this
Fifteenth Day of April, 2025

Coke Morgan Stewart
*Acting Director of the United States Patent and Trademark Office*